(12) United States Patent
Damodaran et al.

(10) Patent No.: US 9,183,084 B2
(45) Date of Patent: Nov. 10, 2015

(54) MEMORY ATTRIBUTE SHARING BETWEEN DIFFERING CACHE LEVELS OF MULTILEVEL CACHE

(75) Inventors: Raguram Damodaran, Plano, TX (US); Joseph Raymond Michael Zbiciak, Arlington, TX (US); Naveen Bhoria, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 75 days.

(21) Appl. No.: 13/247,260

(22) Filed: Sep. 28, 2011

(65) Prior Publication Data

US 2012/0198166 A1    Aug. 2, 2012

Related U.S. Application Data

(60) Provisional application No. 61/387,283, filed on Sep. 28, 2010.

(51) Int. Cl.
| | | |
|---|---|---|
| G06F 12/00 | (2006.01) | |
| G06F 13/00 | (2006.01) | |
| G06F 13/28 | (2006.01) | |
| G06F 11/10 | (2006.01) | |
| G06F 7/483 | (2006.01) | |
| G06F 9/30 | (2006.01) | |
| H03M 13/35 | (2006.01) | |
| H03M 13/29 | (2006.01) | |
| G06F 13/16 | (2006.01) | |
| G06F 13/18 | (2006.01) | |
| H03K 19/00 | (2006.01) | |
| G06F 1/32 | (2006.01) | |
| H03K 21/00 | (2006.01) | |
| G06F 12/02 | (2006.01) | |
| G06F 13/364 | (2006.01) | |

(52) U.S. Cl.
CPC .......... *G06F 11/1064* (2013.01); *G06F 1/3296* (2013.01); *G06F 7/483* (2013.01); *G06F 9/3012* (2013.01); *G06F 12/0246* (2013.01); *G06F 13/1605* (2013.01); *G06F 13/18* (2013.01); *H03K 19/0016* (2013.01); *H03K 21/00* (2013.01); *H03M 13/2903* (2013.01); *H03M 13/353* (2013.01); *G06F 13/1652* (2013.01); *G06F 13/1657* (2013.01); *G06F 13/1663* (2013.01); *G06F 13/364* (2013.01); *Y02B 60/1214* (2013.01); *Y02B 60/1285* (2013.01); *Y02B 60/32* (2013.01)

(58) Field of Classification Search
CPC ............ G06F 12/0888; G06F 12/1027; G06F 12/0897; G06F 12/0862; G06F 12/0815
USPC ......................................................... 711/122
See application file for complete search history.

(56) References Cited

U.S. PATENT DOCUMENTS

| | | | |
|---|---|---|---|
| 5,353,431 A * | 10/1994 | Doyle et al. .................. 711/206 |
| 6,629,187 B1 * | 9/2003 | Krueger et al. .................... 711/3 |
| 2001/0001873 A1 * | 5/2001 | Wickeraad et al. ........... 711/136 |

(Continued)

*Primary Examiner* — Charles Rones
*Assistant Examiner* — Sidney Li
(74) *Attorney, Agent, or Firm* — Robert D. Marshall, Jr.; Frank D. Cimino (57) ABSTRACT

The level one memory controller maintains a local copy of the cacheability bit of each memory attribute register. The level two memory controller is the initiator of all configuration read/write requests from the CPU. Whenever a configuration write is made to a memory attribute register, the level one memory controller updates its local copy of the memory attribute register.

6 Claims, 6 Drawing Sheets

(56) References Cited

U.S. PATENT DOCUMENTS

2003/0126369 A1\* 7/2003 Creta et al. .................. 711/133
2007/0067578 A1\* 3/2007 Kurichiyath .................. 711/141
2009/0158012 A1\* 6/2009 Hansen et al. ................ 712/222

\* cited by examiner

MEMORY ATTRIBUTE SHARING BETWEEN DIFFERING CACHE LEVELS OF MULTILEVEL CACHE

CLAIM OF PRIORITY

This application claims priority under 35 U.S.C. 119(e)(1) to U.S. Provisional Application No. 61/387,283 filed Sep. 28, 2010.

TECHNICAL FIELD OF THE INVENTION

The technical field of this invention is memory control in multilevel cache circuits.

BACKGROUND OF THE INVENTION

Prior art devices implemented a set of memory mapped control registers called memory attribute registers. These registers defined the cacheability of external addresses in the Level one and Level two caches inside the memory system. The entire external address space was controlled by 256 memory address registers. Each memory attribute register defined the cacheability of a corresponding portion of the address space.

In prior art devices, the memory attribute registers were not visible in the level one data cache controller. Due to this, the following performance optimizations that level one data cache controller could have implemented were not possible: merge writes for external addresses based on the cacheability of accesses; optimize some of its cache state machines based on early knowledge of cacheability; and the level one data cache controller must generates and send victims due to read accesses even to non-cacheable external addresses.

SUMMARY OF THE INVENTION

The level one memory controller maintains a local copy of the cacheability bit of each memory attribute register. The level two memory controller is the initiator of all configuration read/write requests from the CPU. Whenever a configuration write is made to a memory attribute register, the level one memory controller updates its local copy of the memory attribute register. The level one memory controller uses the local copy of the cacheability bit to optimize the memory system performance in the following cases: merge writes for external addresses based on the cacheability of accesses; optimize some of its cache state machines based on early knowledge of cacheability; and not generating and sending victims for read accesses to non-cacheable external

BRIEF DESCRIPTION OF THE DRAWINGS

These and other aspects of this invention are illustrated in the drawings, in which.

DETAILED DESCRIPTION OF PREFERRED EMBODIMENTS

Figure 1:
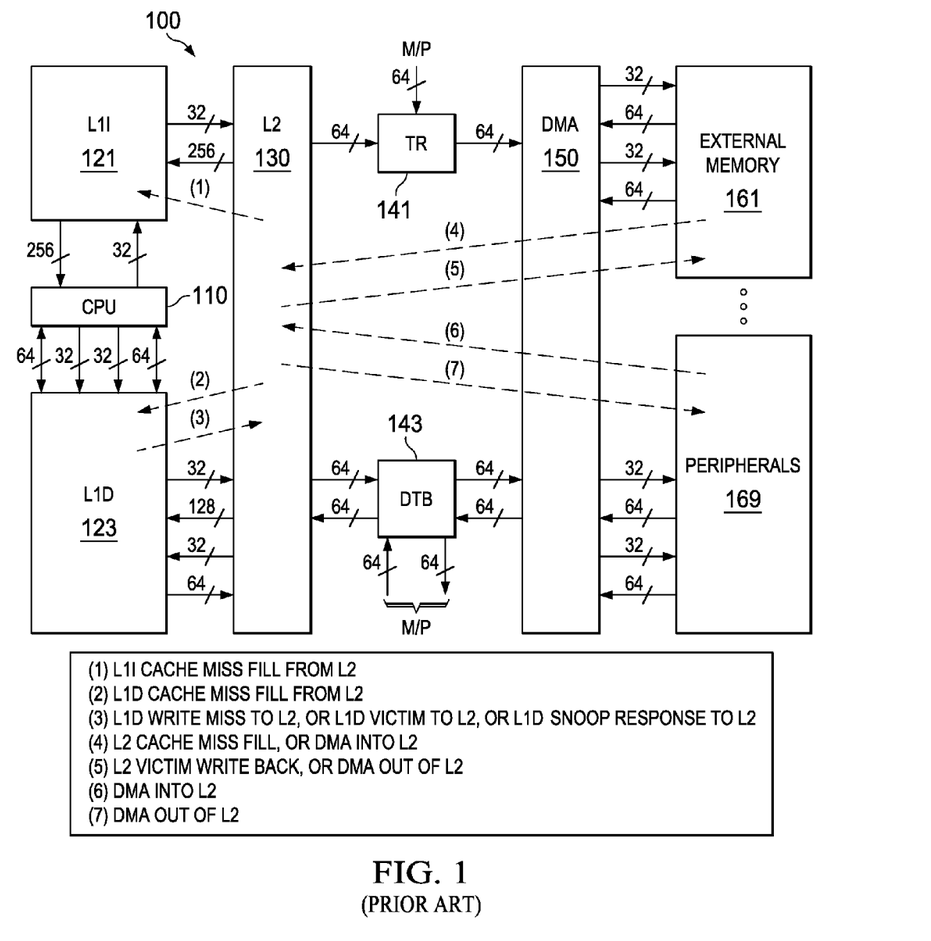
FIG. 1 illustrates the organization of a typical digital signal processor to which this invention is applicable (prior art)

FIG. 1 illustrates the organization of a typical digital signal processor system 100 to which this invention is applicable (prior art). Digital signal processor system 100 includes central processing unit core 110. Central processing unit core 110 includes the data processing portion of digital signal processor system 100. Central processing unit core 110 could be constructed as known in the art and would typically includes a register file, an integer arithmetic logic unit, an integer multiplier and program flow control units. An example of an appropriate central processing unit core is described below in conjunction with FIGS. 2 to 4.

Digital signal processor system 100 includes a number of cache memories. FIG. 1 illustrates a pair of first level caches. Level one instruction cache (L1I) 121 stores instructions used by central processing unit core 110. Central processing unit core 110 first attempts to access any instruction from level one instruction cache 121. Level one data cache (L1D) 123 stores data used by central processing unit core 110. Central processing unit core 110 first attempts to access any required data from level one data cache 123. The two level one caches are backed by a level two unified cache (L2) 130. In the event of a cache miss to level one instruction cache 121 or to level one data cache 123, the requested instruction or data is sought from level two unified cache 130. If the requested instruction or data is stored in level two unified cache 130, then it is supplied to the requesting level one cache for supply to central processing unit core 110. As is known in the art, the requested instruction or data may be simultaneously supplied to both the requesting cache and central processing unit core 110 to speed use.

Level two unified cache 130 is further coupled to higher level memory systems. Digital signal processor system 100 may be a part of a multiprocessor system. The other processors of the multiprocessor system are coupled to level two unified cache 130 via a transfer request bus 141 and a data transfer bus 143. A direct memory access unit 150 provides the connection of digital signal processor system 100 to external memory 161 and external peripherals 169.

FIG. 1 illustrates several data/instruction movements within the digital signal processor system 100. These include: (1) instructions move from L2 cache 130 to L1I cache 121 to fill in response to a L1I cache miss; (2) data moves from L2 cache 130 to L1D cache 123 to fill in response to a L1D cache miss; (3) data moves from L1D cache 123 to L2 cache 130 in response to a write miss in L1D cache 123, in response to a L1D cache 123 victim eviction and in response to a snoop from L2 cache 130; (4) data moves from external memory 161 to L2 cache 130 to fill in response to L2 cache miss or a direct memory access (DMA) data transfer into L2 cache 130; (5) data moves from L2 cache 130 to external memory 161 in response to a L2 cache victim eviction or writeback and in response to a DMA transfer out of L2 cache 130; (6) data moves from peripherals 169 to L2 cache 130 in response to a DMA transfer into L2 cache 130; and (7) data moves from L2 cache 130 to peripherals 169 is response to a DMA transfer out of L2 cache 130.

Figure 2:
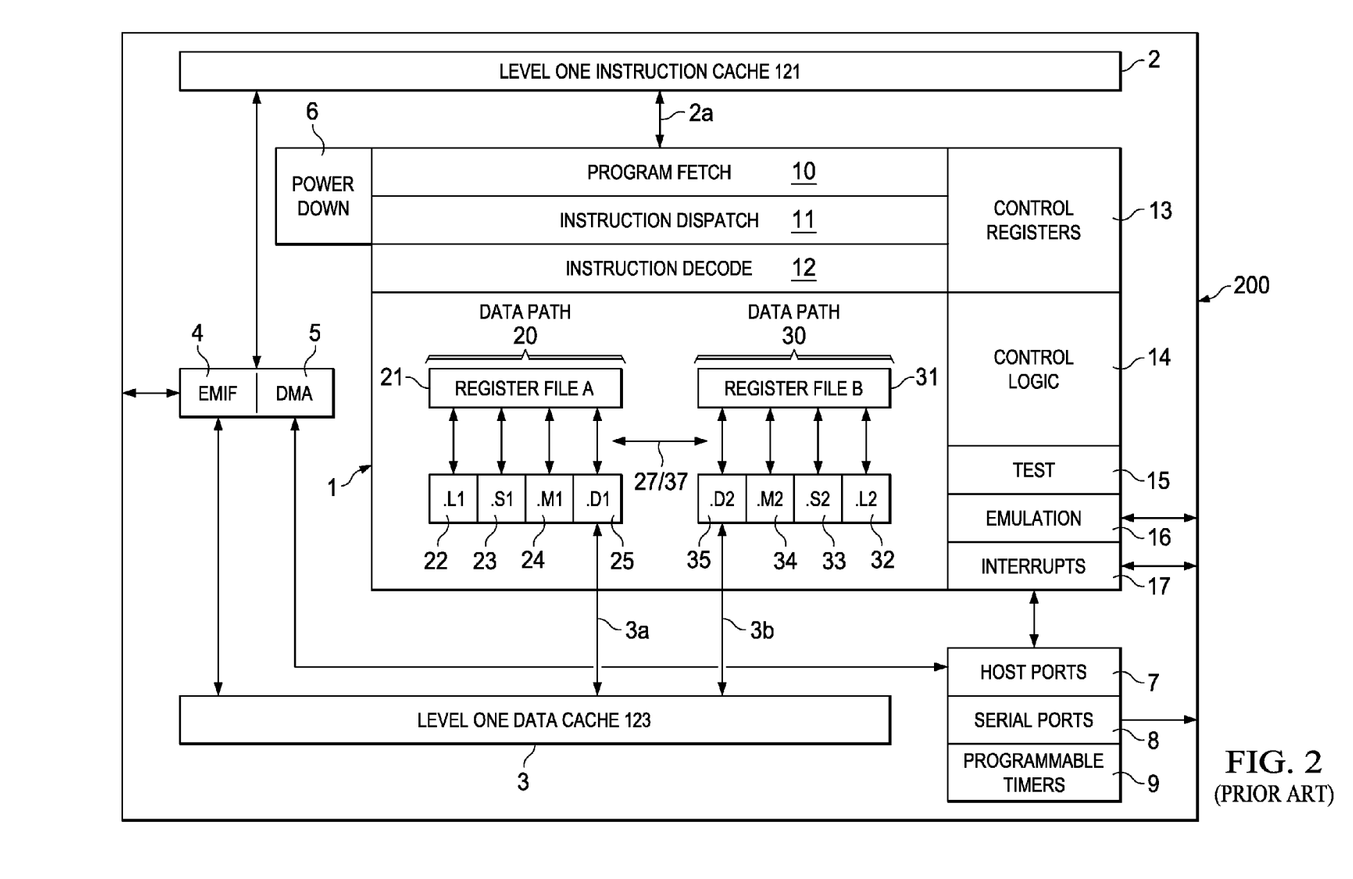
FIG. 2 illustrates details of a very long instruction word digital signal processor core suitable for use in FIG. 1 (prior art)

FIG. 2 is a block diagram illustrating details of a digital signal processor integrated circuit 200 suitable but not essential for use in this invention (prior art). The digital signal processor integrated circuit 200 includes central processing unit 1, which is a 32-bit eight-way VLIW pipelined processor. Central processing unit 1 is coupled to level one instruction cache 121 included in digital signal processor integrated circuit 200. Digital signal processor integrated circuit 200 also includes level one data cache 123. Digital signal processor integrated circuit 200 also includes peripherals 4 to 9. These peripherals preferably include an external memory interface (EMIF) 4 and a direct memory access (DMA) controller 5. External memory interface (EMIF) 4 preferably supports access to supports synchronous and asynchronous SRAM and synchronous DRAM. Direct memory access (DMA) controller 5 preferably provides 2-channel auto-boot loading direct memory access. These peripherals include power-down logic 6. Power-down logic 6 preferably can halt central processing unit activity, peripheral activity, and phase lock loop (PLL) clock synchronization activity to reduce power consumption. These peripherals also include host ports 7, serial ports 8 and programmable timers 9.

Central processing unit 1 has a 32-bit, byte addressable address space. Internal memory on the same integrated circuit is preferably organized in a data space including level one data cache 123 and a program space including level one instruction cache 121. When off-chip memory is used, preferably these two spaces are unified into a single memory space via the external memory interface (EMIF) 4.

Level one data cache 123 may be internally accessed by central processing unit 1 via two internal ports 3a and 3b. Each internal port 3a and 3b preferably has 32 bits of data and a 32-bit byte address reach. Level one instruction cache 121 may be internally accessed by central processing unit 1 via a single port 2a. Port 2a of level one instruction cache 121 preferably has an instruction-fetch width of 256 bits and a 30-bit word (four bytes) address, equivalent to a 32-bit byte address.

Central processing unit 1 includes program fetch unit 10, instruction dispatch unit 11, instruction decode unit 12 and two data paths 20 and 30. First data path 20 includes four functional units designated L1 unit 22, S1 unit 23, M1 unit 24 and D1 unit 25 and 16 32-bit A registers forming register file 21. Second data path 30 likewise includes four functional units designated L2 unit 32, S2 unit 33, M2 unit 34 and D2 unit 35 and 16 32-bit B registers forming register file 31. The functional units of each data path access the corresponding register file for their operands. There are two cross paths 27 and 37 permitting access to one register in the opposite register file each pipeline stage. Central processing unit 1 includes control registers 13, control logic 14, and test logic 15, emulation logic 16 and interrupt logic 17.

Program fetch unit 10, instruction dispatch unit 11 and instruction decode unit 12 recall instructions from level one instruction cache 121 and deliver up to eight 32-bit instructions to the functional units every instruction cycle. Processing occurs simultaneously in each of the two data paths 20 and 30. As previously described each data path has four corresponding functional units (L, S, M and D) and a corresponding register file containing 16 32-bit registers. Each functional unit is controlled by a 32-bit instruction. The data paths are further described below. A control register file 13 provides the means to configure and control various processor operations.

Figure 3:
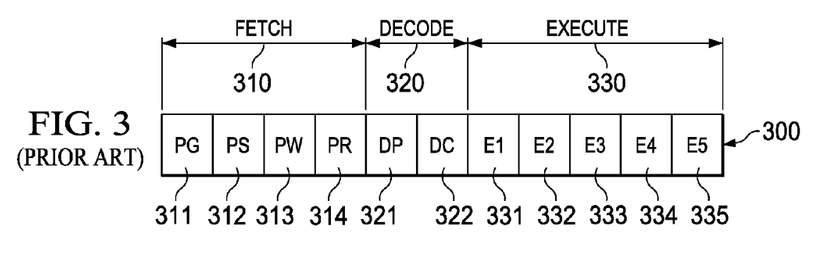
FIG. 3 illustrates the pipeline stages of the very long instruction word digital signal processor core illustrated in FIG. 2 (prior art)

FIG. 3 illustrates the pipeline stages 300 of digital signal processor core 110 (prior art). These pipeline stages are divided into three groups: fetch group 310; decode group 320; and execute group 330. All instructions in the instruction set flow through the fetch, decode, and execute stages of the pipeline. Fetch group 310 has four phases for all instructions, and decode group 320 has two phases for all instructions. Execute group 330 requires a varying number of phases depending on the type of instruction.

The fetch phases of the fetch group 310 are: Program address generate phase 311 (PG); Program address send phase 312 (PS); Program access ready wait stage 313 (PW); and Program fetch packet receive stage 314 (PR). Digital signal processor core 110 uses a fetch packet (FP) of eight instructions. All eight of the instructions proceed through fetch group 310 together. During PG phase 311, the program address is generated in program fetch unit 10. During PS phase 312, this program address is sent to memory. During PW phase 313, the memory read occurs. Finally during PR phase 314, the fetch packet is received at CPU 1.

The decode phases of decode group 320 are: Instruction dispatch (DP) 321; and Instruction decode (DC) 322. During the DP phase 321, the fetch packets are split into execute packets. Execute packets consist of one or more instructions which are coded to execute in parallel. During DP phase 322, the instructions in an execute packet are assigned to the appropriate functional units. Also during DC phase 322, the source registers, destination registers and associated paths are decoded for the execution of the instructions in the respective functional units.

The execute phases of the execute group 330 are: Execute 1 (E1) 331; Execute 2 (E2) 332; Execute 3 (E3) 333; Execute 4 (E4) 334; and Execute 5 (E5) 335. Different types of instructions require different numbers of these phases to complete. These phases of the pipeline play an important role in understanding the device state at CPU cycle boundaries.

During E1 phase 331, the conditions for the instructions are evaluated and operands are read for all instruction types. For load and store instructions, address generation is performed and address modifications are written to a register file. For branch instructions, branch fetch packet in PG phase 311 is affected. For all single-cycle instructions, the results are written to a register file. All single-cycle instructions complete during the E1 phase 331.

During the E2 phase 332, for load instructions, the address is sent to memory. For store instructions, the address and data are sent to memory. Single-cycle instructions that saturate results set the SAT bit in the control status register (CSR) if saturation occurs. For single cycle 16 by 16 multiply instructions, the results are written to a register file. For M unit non-multiply instructions, the results are written to a register file. All ordinary multiply unit instructions complete during E2 phase 322.

During E3 phase 333, data memory accesses are performed. Any multiply instruction that saturates results sets the SAT bit in the control status register (CSR) if saturation occurs. Store instructions complete during the E3 phase 333.

During E4 phase 334, for load instructions, data is brought to the CPU boundary. For multiply extension instructions, the results are written to a register file. Multiply extension instructions complete during the E4 phase 334.

During E5 phase 335, load instructions write data into a register. Load instructions complete during the E5 phase 335.

Figure 4:
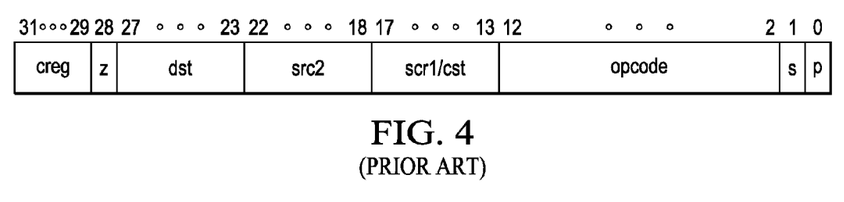
FIG. 4 illustrates the instruction syntax of the very long instruction word digital signal processor core illustrated in FIG. 2 (prior art)

FIG. 4 illustrates an example of the instruction coding of instructions used by digital signal processor core 110 (prior art). Each instruction consists of 32 bits and controls the operation of one of the eight functional units. The bit fields are defined as follows. The creg field (bits 29 to 31) is the conditional register field. These bits identify whether the instruction is conditional and identify the predicate register. The z bit (bit 28) indicates whether the predication is based upon zero or not zero in the predicate register. If z=1, the test is for equality with zero. If z=0, the test is for nonzero. The case of creg=0 and z=0 is treated as always true to allow unconditional instruction execution. The creg field is encoded in the instruction opcode as shown in Table 1.

TABLE 1

| | Conditional Register | | | |
| --- | --- | --- | --- | --- |
| | creg | | | z |
| | 31 | 30 | 29 | 28 |
| Unconditional | 0 | 0 | 0 | 0 |
| Reserved | 0 | 0 | 0 | 1 |
| B0 | 0 | 0 | 1 | z |
| B1 | 0 | 1 | 0 | z |
| B2 | 0 | 1 | 1 | z |
| A1 | 1 | 0 | 0 | z |
| A2 | 1 | 0 | 1 | z |
| A0 | 1 | 1 | 0 | z |
| Reserved | 1 | 1 | 1 | x |

Note that "z" in the z bit column refers to the zero/not zero comparison selection noted above and "x" is a don't care state. This coding can only specify a subset of the 32 registers in each register file as predicate registers. This selection was made to preserve bits in the instruction coding.

The dst field (bits 23 to 27) specifies one of the 32 registers in the corresponding register file as the destination of the instruction results.

The scr2 field (bits 18 to 22) specifies one of the 32 registers in the corresponding register file as the second source operand.

The scr1/cst field (bits 13 to 17) has several meanings depending on the instruction opcode field (bits 3 to 12). The first meaning specifies one of the 32 registers of the corresponding register file as the first operand. The second meaning is a 5-bit immediate constant. Depending on the instruction type, this is treated as an unsigned integer and zero extended to 32 bits or is treated as a signed integer and sign extended to 32 bits. Lastly, this field can specify one of the 32 registers in the opposite register file if the instruction invokes one of the register file cross paths 27 or 37.

The opcode field (bits 3 to 12) specifies the type of instruction and designates appropriate instruction options. A detailed explanation of this field is beyond the scope of this invention except for the instruction options detailed below.

The s bit (bit 1) designates the data path 20 or 30. If s=0, then data path 20 is selected. This limits the functional unit to L1 unit 22, S1 unit 23, M1 unit 24 and D1 unit 25 and the corresponding register file A 21. Similarly, s=1 selects data path 20 limiting the functional unit to L2 unit 32, S2 unit 33, M2 unit 34 and D2 unit 35 and the corresponding register file B 31.

The p bit (bit 0) marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to eight instructions. Each instruction in an execute packet must use a different functional unit.

Figure 5:
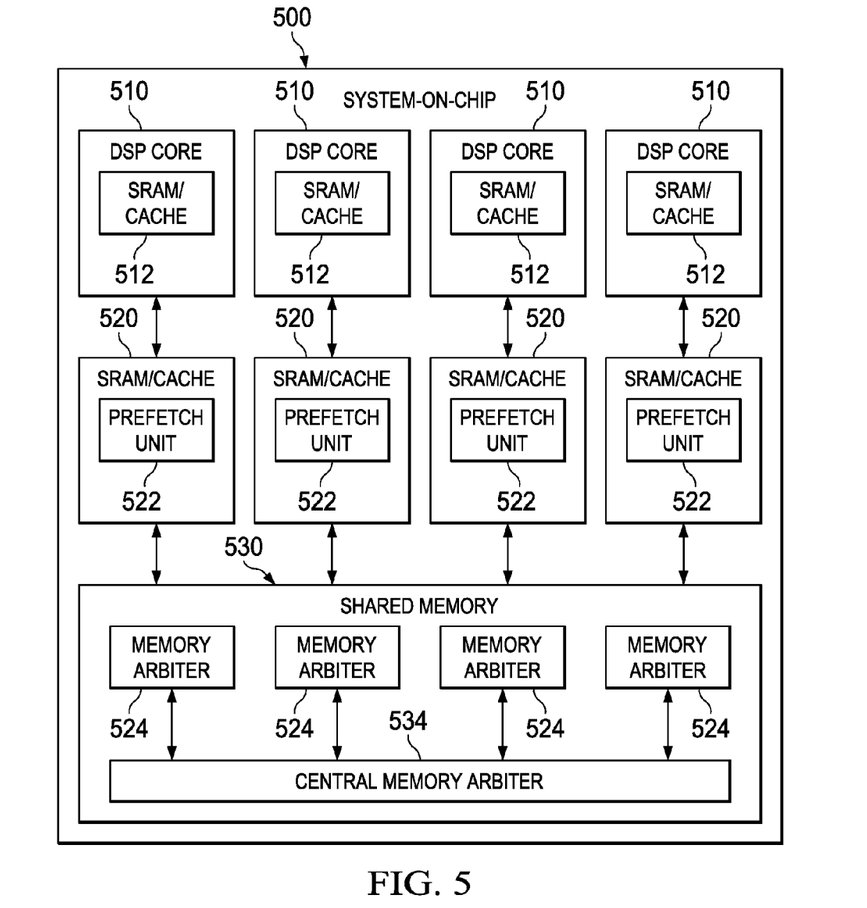
FIG. 5 illustrates a computing system including a local memory arbiter according to an embodiment of the invention.

FIG. 5 is a block diagram illustrating a computing system including a local memory arbiter according to an embodiment of the invention. FIG. 5 illustrates system on a chip (SoC) 500. SoC 500 includes one or more DSP cores 510, SRAM/Caches 520 and shared memory 530. SoC 500 is preferably formed on a common semiconductor substrate. These elements can also be implemented in separate substrates, circuit boards and packages. For example shared memory 530 could be implemented in a separate semiconductor substrate. FIG. 5 illustrates four DSP cores 510, but SoC 500 may include fewer or more DSP cores 510.

Each DSP core 510 preferably includes a level one data cache such as L1 SRAM/cache 512. In the preferred embodiment each L1 SRAM/cache 512 may be configured with selected amounts of memory directly accessible by the corresponding DSP core 510 (SRAM) and data cache. Each DSP core 510 has a corresponding level two combined cache L2 SRAM/cache 520. As with L1 SRAM/cache 512, each L2 SRAM/cache 520 is preferably configurable with selected amounts of directly accessible memory (SRAM) and data cache. Each L2 SRAM/cache 520 includes a prefetch unit 522. Each prefetch unit 522 prefetchs data for the corresponding L2 SRAM/cache 520 based upon anticipating the needs of the corresponding DSP core 510. Each DSP core 510 is further coupled to shared memory 530. Shared memory 530 is usually slower and typically less expensive memory than L2 SRAM/cache 520 or L1 SRAM/cache 512. Shared memory 530 typically stores program and data information shared between the DSP cores 510.

In various embodiments, each DSP core 510 includes a corresponding local memory arbiter 524 for reordering memory commands in accordance with a set of reordering rules. Each local memory arbiter 524 arbitrates and schedules memory requests from differing streams at a local level before sending the memory requests to central memory arbiter 534. A local memory arbiter 524 may arbitrate between more than one DSP core 510. Central memory arbiter 534 controls memory accesses for shared memory 530 that are generated by differing DSP cores 510 that do not share a common local memory arbiter 524.

Figure 6:
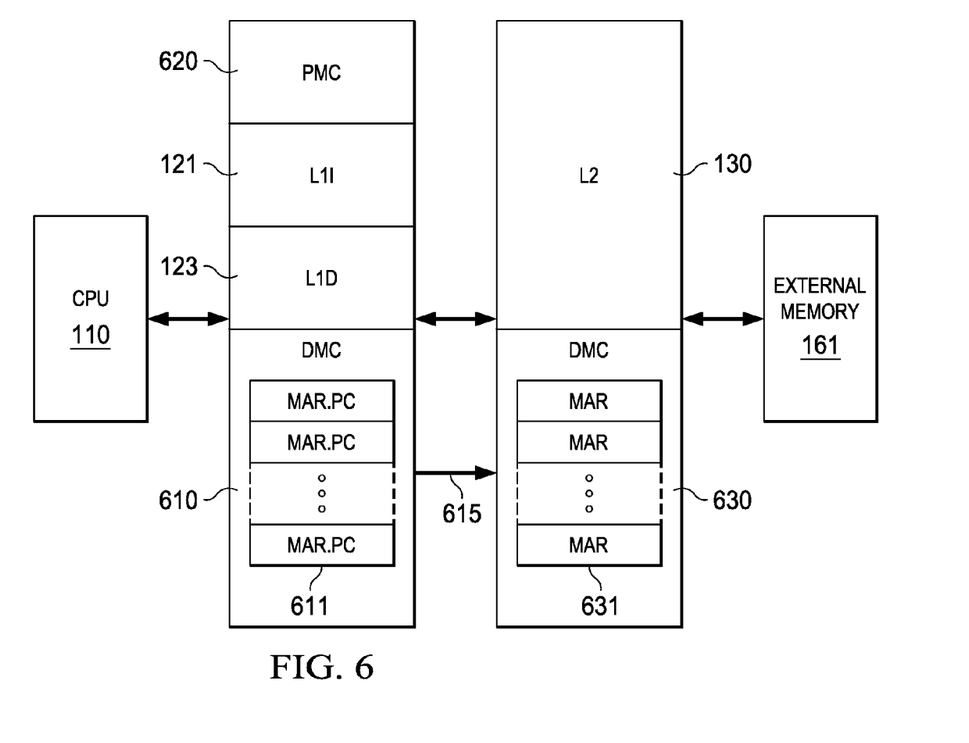
FIG. 6 is a further view of the digital signal processor system of this invention illustrating the various cache controllers.

FIG. 6 is a further view of the digital signal processor system 100 of this invention. CPU 110 is bidirectionally connected to L1I cache 121 and L1D cache 123. L1I cache 121 and L1D cache 123 are shown together because they are at the same level in the memory hierarchy. These level one caches are bidirectionally connected to L2 130. L2 cache 130 is in turn bidirectionally connected to external memory 161 and peripherals 169. External memory 161 and peripherals 169 are shown together because they are at the same level in the memory hierarchy. Data transfers into and out of L1D cache 123 are controlled by data memory controller (DMC) 610. Data transfers into and out of L1I cache 121 is are controlled by program memory controller (PMC) 620. Data transfers into and out of L2 130 including both cache and directly addressable memory (SRAM) are controlled by unified memory controller (UMC) 630.

FIG. 6 illustrates further details of DMC 610 and UMC 630. UMC 630 includes memory attribute registers 631. These will be further described below. DMC 610 stores the PC bits of memory attribute registers 611. These are copies of the PC bits of memory attribute registers 631 stored in UMC 630.

The type of access to external memory permitted is controlled by a set of memory attribute registers (MAR). Each memory attribute register stores data indicating the permitted accesses for a corresponding address range within the external memory map.

Figure 7:
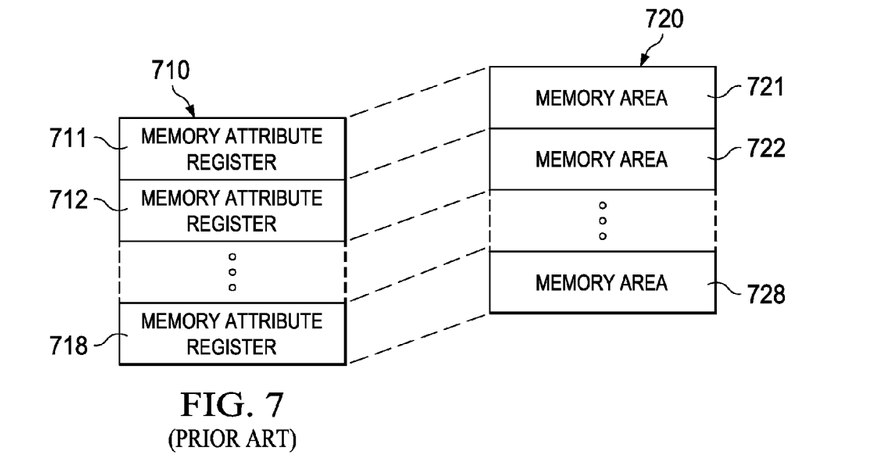
FIG. 7 illustrates the relationship between memory attribute registers and the external memory map.

FIG. 7 illustrates the relationship between memory attribute registers and the external memory map. Memory attribute registers 710 includes plural registers 711 to 718. Each memory attribute register 711 to 718 controls memory access to a corresponding memory area 721 to 728 of memory map 720. The prior art generally divides memory map 720 into a number of areas 721 to 728 equal to an integral power of 2 ($2^N$, where N is an integer). This division implies a similar number of memory attribute registers 711 to 718 ($2^N$). Typically each memory attribute register stores data for similarly sized portions of memory map 720. Thus areas 721 to 728 are typically equal in size. The $2^N$ number and the equal size areas are not required. The essential requirement is that a unique, single memory attribute register corresponds to each address of the memory map.

The external memory access controller uses memory attributes registers 710 on all memory accesses. The address of the memory access identifies one of memory attribute registers 711 to 718 corresponding to that access. The external memory access controller accesses data stored in that corresponding memory attribute register 711 to 718. The external memory access controller performs the requested memory access according to the memory accesses permitted by the memory access data.

Figure 8:
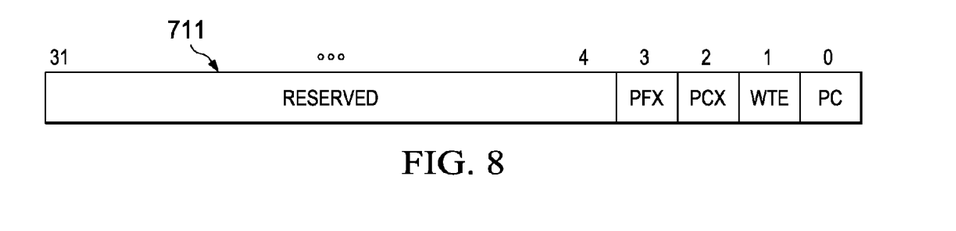
FIG. 8 illustrates a typical memory attribute register corresponding to a preferred embodiment this invention.

FIG. 8 illustrates a typical memory attribute register 711 corresponding to a preferred embodiment this invention. Memory attribute register 711 includes 32 bits. Bits 4 to 32 are reserved and not used in this preferred embodiment. In a practical application of this invention these bits need not be physically implemented. Bit 0 is the Permit Caching (PC) bit. If PC is 1, then caching of the corresponding area of memory 720 in level one instruction cache 121, level one data cache 123 and level two unified cache 130 is permitted. If PC is 0, then caching is not permitted. Bit 1 is the Write Through Enable (WTE) bit. If WTE is 1, then write-through is enabled. If WTE is 0, then write-through is disabled and only write-back is permitted. Bit 2 is the Permit Cache External (PCX) bit. If the PCX bit is 0, then data of the corresponding address range is not cacheable in an external cache. If the PCX bit is 1, then such data is cacheable in an external cache. Bit 3 is the Permit Prefetch External (PFX) bit. The PFX bit indicates whether a given address range is prefetchable by external prefetching engines. If the PFX bit is 0, then data of the corresponding address range is not prefetchable. If the PFX bit is 1, then such data is prefetchable.

Table 2 lists the reset values and access privileges of the PFX, PCX, WTE and PC bits. In Table 2: SR means supervisor mode may read; SRW means supervisor mode may read and write; UR means user mode may read; and the indication following the + sign is the default state upon initialization.

TABLE 2

| MAR Register Range | PFX | PCX | WTE | PC |
|---|---|---|---|---|
| 0 | SR, UR, +0 | SR, UR, +0 | SR, UR, +0 | SR, UR, +1 |
| 1-11 | SR, UR, +0 | SR, UR, +0 | SR, UR, +0 | SR, UR, +0 |
| 12-15 | SRW, UR, +1 | SRW, UR, +1 | SRW, UR, +0 | SRW, UR, +0 |
| 15-255 | SRW, UR, +1 | SRW, UR, +1 | SRW, UR, +0 | SRW, UR, +0 |

The WTE and PC bits interact as shown below in Table 3. According to the preferred embodiment of this invention an program application running on the data processor can select between Write-back and Write-through at level one data cache 123 according to the state of the corresponding WTE bit. Write-through is not enabled by default. The memory attribute register WTE bit is 0 at reset. The application must write a 1 to the WTE field to enable write-through cache mode. Table 3 lists the valid use modes of the PC bit and the WTE bit.

TABLE 3

| PC | WTE | L1 Data Cache | L2 Combined Cache |
|---|---|---|---|
| 0 | — | non-cacheable | non-cacheable |
| 1 | 0 | write-back L1 Data Cache | allocate only on hits |
| 1 | 1 | write-through L1 Data Cache | write-through on hits no allocates on misses |

If the corresponding PC bit is 0, then caching is not allowed (data non-cacheable). In this case the state of the WTE bit is not relevant. The state of the WTE bit is only relevant if caching is allowed (PC is 1). If the corresponding PC bit is 1 and the WTE bit is 0, then only write-back is permitted in level one data cache 123. Under these conditions only level two unified cache 130 allocates upon write misses. If the corresponding PC bit is 1 and the WTE bit is 1, write-through is enabled in level one data cache 123. Under these conditions level two unified cache 130 writes-through on hits and does not allocate on misses.

The memory attribute register PC bits (Permit Caching in L1/L2) are visible to DMC 610 via copies 611. This permits DMC 610 to merge writes for external addresses based on the cacheability of accesses. DMC 610 may also optimize some of its cache state machines based on early knowledge of cacheability.

DMC 610 may merge writes to external addresses if the MAR.PC bit of registers 611 corresponding to those addresses is 1. DMC 610 must preserve discrete writes to non-cacheable address spaces because the target of these writes may have side effects. In the prior art the level one memory controller did not know whether an external address was cacheable. Thus the level one memory controller never merged external writes. With knowledge of MAR.PC for a given external address, DMC 610 knows when it can safely merge writes.

DMC 610 may also implement some minor optimizations to its cache state machines based on early knowledge of whether a given read miss is to cacheable or non-cacheable external memory. DMC 610 need not generate and send victims for read accesses to non-cacheable external addresses.

Figure 9:
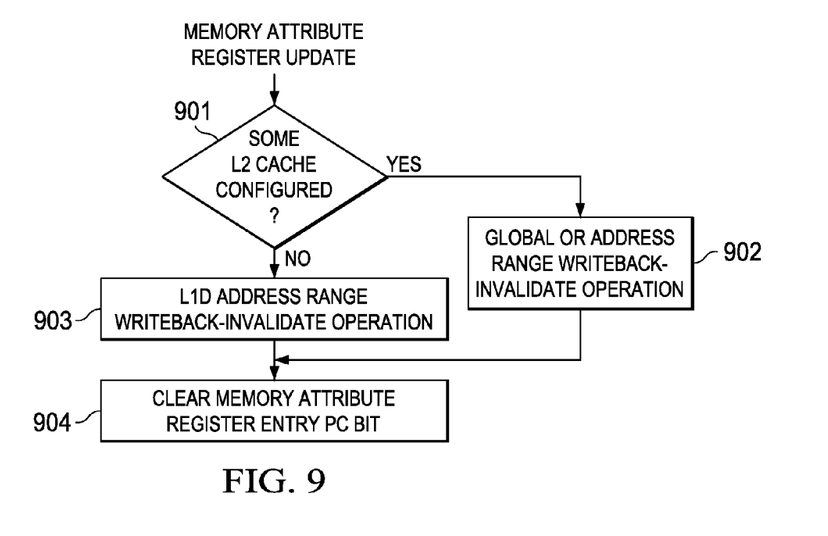
FIG. 9 illustrates the sequence when MAR registers 631 are updated.

FIG. 9 illustrates the sequence when MAR registers 631 are updated. The update must follow this following sequence to ensure that all future accesses to the particular address range are not cached in L1 and L2 caches.

The program must insure that all addresses within the affected range are removed from the L1 and L2 caches. This is accomplished in one of the following ways. Any one of the following operations should be sufficient. Test block 901 determines if L2 cache 130 has at least some cache enabled. If L2 cache 130 includes at least some cache (Yes at test block 901), invoke a global writeback-invalidate cache operation or an address block writeback-invalidate of the affected range (block 902). Flow then proceeds to block 904 described below. If L2 cache 130 is in all SRAM mode (No at test block 901), then invoke an address block writeback-invalidate of the affected range from IAD cache 123 (block 903). In the preferred embodiment the block-oriented cache controls can only operate on a 256K-byte address range at a time. Thus multiple block writeback-invalidate operations may be necessary to remove the entire affected address range from the cache. It is then safe to clear the PC bit in the appropriate memory attribute register entry to 0 (block 904).

What is claimed is:

1. A data processing system comprising:
a central processing unit executing program instructions to manipulate data;
a first level data cache connected to said central processing unit temporarily storing in a plurality of cache lines data for manipulation by said central processing unit;
a first level data cache controller connected to said first level data cache controlling data transfers into and out of said first level data cache;
a second level cache connected to said first level cache including second level cache temporarily storing in a plurality of cache lines data for manipulation by said central processing unit;
a second level data cache controller connected to said second level data cache controlling data transfers into and out of said second level data cache, said second level cache controller including a plurality of first memory attribute registers each storing a plurality of memory access attributes for a corresponding address range of external memory including cacheability bits; and
wherein said first level data cache controller further includes a plurality of second memory attribute registers, each second memory attribute register storing a copy of said cacheability bits of a corresponding one of said plurality of first memory attribute registers for said corresponding address range of external memory.

2. The data processing system of claim 1, wherein:
upon a central processing unit write generating a miss in said first level data cache, said first level cache controller operable to
read cacheability bits from a second memory attribute register having a corresponding address range of external memory including a write address of said central processing unit write,
immediately writing to external memory if said cacheability bits indicate non-cacheable, and
merging a plurality of such central processing unit writes before writing to external memory if said cacheability bits indicate cacheable.

3. The data processing system of claim 1, wherein:
upon a central processing unit read generating a miss in said first level data cache, said first level cache controller operable to
read cacheability bits from a second memory attribute register having a corresponding address range of external memory including a read address of said central processing unit read,
identifying a cache line in said first level data cache for replacement and writing said identified cache line to external memory if dirty and if said cacheability bits indicated cacheable, and
not identifying a cache line in said first level data cache for replacement if said cacheability bits indicated non-cacheable.

4. The data processing system of claim 1, wherein:
said memory access attributes stored in said plurality first memory attribute registers include whether write-through is enabled for the corresponding address range of external memory.

5. The data processing system of claim 1, wherein:
said memory access attributes stored in said plurality first memory attribute registers include whether external caching is enabled for the corresponding address range of external memory.

6. The data processing system of claim 1, wherein:
said memory access attributes stored in said plurality first memory attribute registers include whether cache prefetch is enabled for the corresponding address range of external memory.

* * * * *